United States Patent [19]
Knecht et al.

[11] Patent Number: 5,446,954
[45] Date of Patent: Sep. 5, 1995

[54] METHOD FOR MANUFACTURING A FREQUENCY CONTROL DEVICE

[75] Inventors: Thomas A. Knecht, Algonquin; Jean-Robert Achille, Bloomingdale; Charles K. Adams, Hoffman Estates; Michael T. Cox, Elgin, all of Ill.

[73] Assignee: Motorla, Inc., Schaumburg, Ill.

[21] Appl. No.: 128,790

[22] Filed: Sep. 30, 1993

[51] Int. Cl.⁶ .................... H01L 41/22; H01L 41/053
[52] U.S. Cl. .................... 29/25.35; 310/315; 310/344
[58] Field of Search ............... 29/25.35; 310/312, 315, 310/341, 344, 360; 228/121

[56] References Cited
U.S. PATENT DOCUMENTS 2,278,966  4/1942  Williams ............... 29/25.35 X
4,472,652  9/1984  Brice et al. ............ 310/344 X
4,750,246  6/1988  Pollard ................ 29/25.35

FOREIGN PATENT DOCUMENTS 92428  10/1983  European Pat. Off. ........... 29/25.35
56-28512  3/1981  Japan ........................ 29/25.35

Primary Examiner—Peter Vo
Attorney, Agent, or Firm—Christopher P. Moreno; James A. Coffing

[57] ABSTRACT

A method of manufacturing is employed to produce a size-reduced frequency control device (300), according to the present invention. A temperature compensation circuit (304) and an unsealed piezoelectric element (302) are disposed on a substrate (306) such that the compensation circuit and the unsealed piezoelectric element are electrically connected. A hermetic seal (318) is established between a lid (308) and the substrate such that the unsealed piezoelectric element and at least a temperature sensitive portion of the temperature compensation circuit occupy a sealed environment (320). In this manner, dimensions (322, 324) of the frequency control device are reduced.

20 Claims, 1 Drawing Sheet

METHOD FOR MANUFACTURING A FREQUENCY CONTROL DEVICE

FIELD OF THE INVENTION

The present invention relates generally to frequency control devices and, in particular, to a method for manufacturing frequency control devices.

BACKGROUND OF THE INVENTION

Frequency control devices are known to include temperature-compensated crystal oscillators (TCXO). A typical TCXO utilizes piezoelectric materials and temperature compensation circuitry to produce reliable oscillator output (e.g., high frequency waveforms) under varying environmental conditions. Such devices are commonly found in portable radio frequency (RF) communication equipment, such as cellular telephones. As consumer demand continually drives down the size of cellular telephones, the need for TCXO's having smaller dimensions becomes greater.

FIG. 1 illustrates a cross-sectional block diagram of a prior art TCXO (100) including a sealed piezoelectric element (102), temperature compensation circuitry (104), a substrate (106), input/output pads (107), and a device lid (108). The sealed piezoelectric element (102) includes a piezoelectric crystal (110), conductive adhesive (112), a crystal package (114), and a crystal package lid (116). Furthermore, a hermetic seal (118) disposed between the crystal package (114) and crystal package lid (116) creates an isolated crystal environment (120).

When a voltage is applied across the crystal (110), the crystal (110) resonates to produce the oscillator output. Also, the resonant frequency changes (i.e., drifts about a nominal frequency) responsive to changes in the temperature of the isolated crystal environment (120). A temperature sensing device (not shown) provides information to the temperature compensation circuitry (104) regarding the isolated crystal environment (120). As the temperature within the isolated crystal environment (120) fluctuates, the temperature compensation circuitry (104) modifies circuit parameters to ensure minimal frequency drift in the oscillator output.

Obviously, the height (124) and width (122) of the TCXO (100) are partially dependent upon the sealed piezoelectric element (102). That is, the finite thicknesses of the crystal package (114) and the crystal package lid (116) add to the overall dimensions of the TCXO (100). Typical dimensions (in millimeters) for the TCXO (100) shown are 11.4×13.97×3.58. While these dimensions may appear to be quite small, the demand for smaller cellular telephones necessitates TCXO's having even smaller physical dimensions. Therefore, a need exists for frequency control devices which overcome prior art dimensional limitations, but which meet the same performance criteria of their larger counterparts.

DESCRIPTION OF A PREFERRED EMBODIMENT

Generally, the present invention provides a method for manufacturing a frequency control device. This is accomplished by placing a compensation circuit, having a temperature-sensitive portion, on a substrate. An unsealed piezoelectric element is mounted onto a portion of the substrate, such that electrical connection is provided between the compensation circuit and the piezoelectric element to produce an untuned frequency control device. After frequency tuning the untuned frequency control device, a hermetic seal is provided around at least the unsealed piezoelectric element and the temperature-sensitive portion of the compensation circuit. With such a method, dimensional limitations of prior art frequency control devices are overcome.

Figure 2:
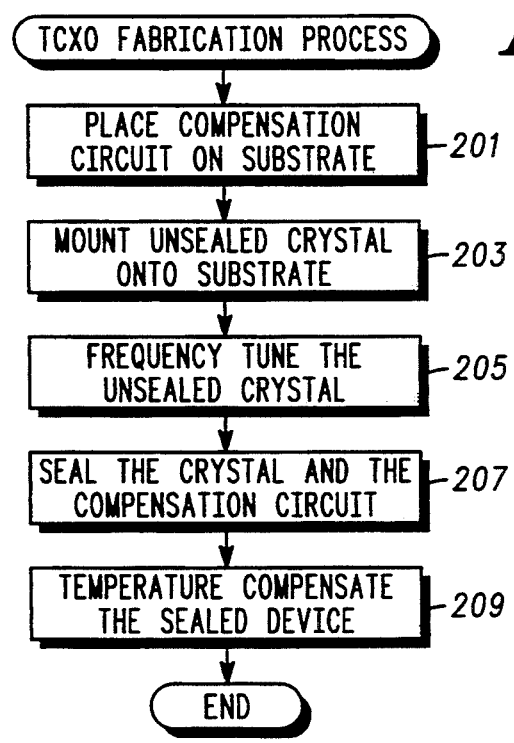
FIG. 2 illustrates a logic diagram which may be incorporated to implement the present invention.

The present invention can be more fully described with references to FIG.'s 2 and 3. FIG. 2 illustrates a logic diagram which may be employed to manufacture a TCXO in accordance with the present invention. At step 201, a compensation circuit is placed on a substrate. The compensation circuit may be an integrated circuit (IC) or discrete components and include a temperature sensitive portion or a discrete temperature-sensitive device. In a preferred embodiment, the compensation circuit includes an IC containing a temperature sensitive portion and two chip capacitors, and the substrate is fabricated from a ceramic material such as co-fired alumina formed into a "bathtub" shape (i.e., a substantially flat base with at least four side walls). Additionally, a brazed metal ring is attached to the substrate at the top of the side walls. After placement of the IC and chip capacitors with silver-filled epoxy, the IC is wire-bonded to metallized input/output connection pads provided on the substrate.

At step 203, an unsealed piezoelectric element is compliantly mounted to a portion of the substrate. In a preferred embodiment, the unsealed piezoelectric element is any one of an AT-cut strip quartz blank, an AT-cut round quartz blank, or a GT-cut quartz blank having electrodes on opposite, substantially-parallel faces of the crystal, such that electro-mechanical connections can be made at either end of the crystal. In the case of a double-end mount, a compliant adhesive, such as silver-filled silicone or epoxy, is used to mount the crystal to prevent undue stresses on the crystal.

Having mounted the crystal (203), the untuned frequency control device is frequency tuned (205) using the compensation circuit as an electrical load. This frequency tuning is achieved through the deposition of additional metal, sometimes referred to as mass loading, on the top electrode of the compliantly-mounted quartz crystal. Such tuning typically lowers the variance of the oscillator output to less than 18 parts per million from the nominal frequency. Note that in prior art frequency control devices, the sealed piezoelectric element (102) required the use of an artificial electrical load unrelated to the actual electrical load for tuning. Accordingly, the present invention provides an improved tuning method since the tuning can be performed under actual loading conditions.

After frequency tuning, the unsealed piezoelectric element, and at least the temperature sensitive portion or discrete temperature-sensitive device are hermetically sealed (207). In a preferred embodiment, a parallel seamweld between a metal lid and the brazed metal ring attached to the substrate creates a hermetic seal such that the unsealed piezoelectric element and temperature compensation circuit (IC-based) reside within the sealed environment.

At step 209, the sealed frequency control device is temperature compensated over a predetermined operating range. This is accomplished by operating the device over the predetermined range and storing frequency output versus temperature readings into, for example, an electrically-erasable, programmable read-only memory (EEPROM) included in the temperature compensation circuitry. An algorithm, stored as software in memory within the temperature compensation circuitry, calculates those capacitor values needed to compensate for frequency variations at each tested temperature. The resulting device is a TCXO, manufactured in accordance with the present invention.

Figure 3:
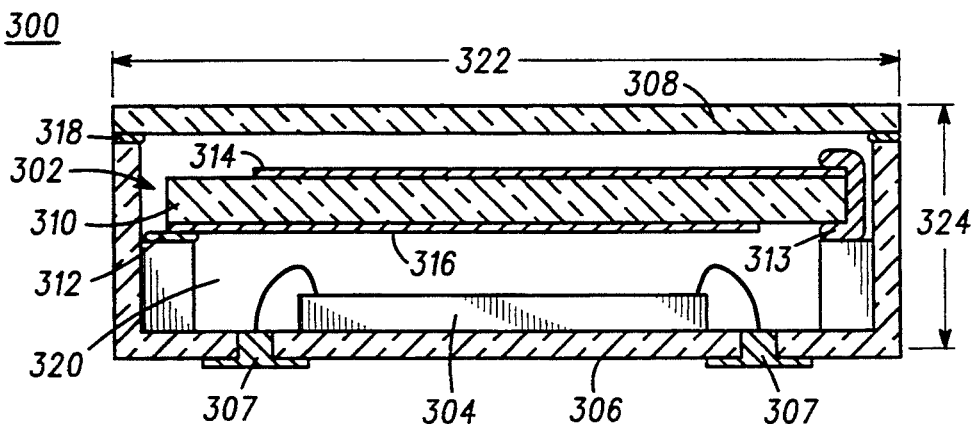
FIG. 3 illustrates a cross-sectional view of a TCXO manufactured in accordance with the present invention.

FIG. 3 illustrates a TCXO (300) manufactured in accordance with a preferred embodiment of the present invention. The TCXO (300) includes an unsealed piezoelectric element (302), a temperature compensation IC (304), a substrate (306), input/output pads (307), and a metal lid (308). A hermetic seal (318), established by seamwelding the metal lid (308) to the substrate (306) in an inert atmosphere, encloses the unsealed piezoelectric element (302), the temperature compensation IC (304), and chip capacitors (not shown) within the same environment (320). The temperature compensation IC (304) is mechanically secured to the substrate (306) using an epoxy (not shown). Furthermore, the temperature compensation IC (304) is electrically wirebonded to metallization on the substrate (306). Tungsten-filled feedthrough holes are used to complete the connection of the compensation IC (304) to the input/output pads (307).

Figure 1:
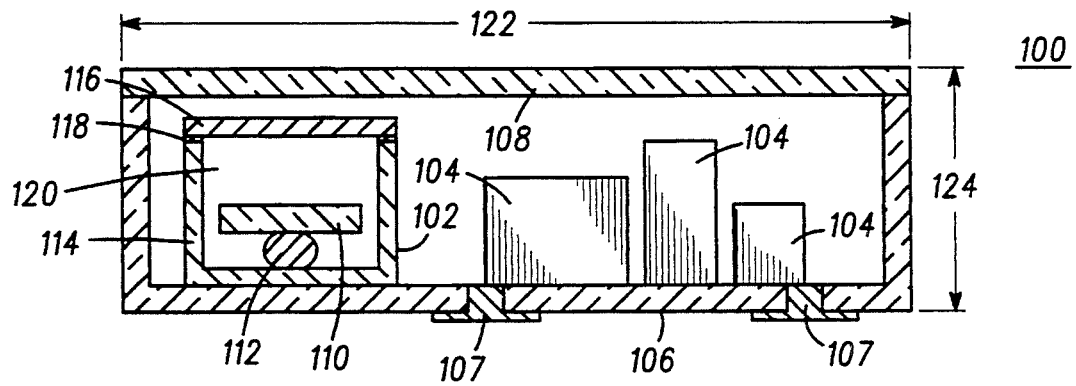
FIG. 1 illustrates a cross-sectional view of a typical prior art TCXO.

The unsealed piezoelectric element (302), preferably comprising an AT-cut quartz crystal strip (310) having a top electrode (314) and a bottom electrode (316), is electrically and mechanically connected to metallized pads (not shown) on top of ledges formed in the substrate using compliant conductive adhesive layers (312,313). Note that the compliant conductive adhesive (313) is wrapped over the edge of the crystal strip (310) to establish contact with the top electrode (314). In this configuration, the crystal strip (310) and the compensation IC (304) are electrically coupled, such that the frequency tuning (205) and temperature compensation (209) can occur as described above. Through the elimination of the redundant crystal packaging (e.g., the crystal package (114) and the crystal package lid (116) of FIG. 1), the height (324), width (322), and depth (not shown) of the TCXO (300) are reduced. A TCXO (300) manufactured in accordance with the present invention can have dimensions (in millimeters) of 8.89×8.89×2.79, representing less than 39% total volume of prior art TCXO's (100).

The present invention provides a method for manufacturing a frequency control device (e.g., a TCXO). With such a method, the double-packaging of piezoelectric crystals, found in prior art devices, is eliminated. This is accomplished by configuring the hermetically-sealed package such that the unsealed piezoelectric element and at least the temperature sensitive portion of the temperature compensation circuit are enclosed within the same environment. In this manner, frequency control devices having reduced dimensions can be manufactured.

We claim:

1. A method for manufacturing a frequency control device comprising the steps of:
   A) providing a substrate;
   B) providing an unsealed piezoelectric element having a plurality of electrodes, the unsealed piezoelectric element to be disposed directly onto a portion of the substrate;
   C) disposing a compensation circuit for providing temperature compensation for the unsealed piezoelectric element onto the substrate, the compensation circuit comprising an integrated circuit and a temperature sensitive portion thereof;
   D) mounting the unsealed piezoelectric element directly onto the substrate using a compliant conductive adhesive, wherein electrical connection is provided between the unsealed piezoelectric element and the compensating circuit, to provide an untuned frequency control device; and
   E) providing a hermetic seal around at least the unsealed piezoelectric element and the temperature-sensitive portion of the integrated circuit, wherein the unsealed piezoelectric element and the temperature-sensitive portion of the integrated circuit are substantially enclosed in a single environment, to produce the frequency control device.

2. The method of claim 1 further comprising the step of:
   F) frequency tuning the untuned frequency control device.

3. The method of claim 2 wherein step F) comprises the step of mass loading at least one of the plurality of electrodes.

4. The method of claim 1 wherein step B) further comprises the step of providing the unsealed piezoelectric element, the unsealed piezoelectric element comprising a quartz blank.

5. The method of claim 4 wherein step B further comprises the step of providing the unsealed piezoelectric element, the unsealed piezoelectric element comprising an AT-cut strip quartz blank.

6. The method of claim 4 wherein step B further comprises the step of providing the unsealed piezoelectric element, the unsealed piezoelectric element comprising an AT-cut round quartz blank.

7. The method of claim 4 wherein step B further comprises the step of providing the unsealed piezoelectric element, the unsealed piezoelectric element comprising a GT-cut quartz blank.

8. The method of claim 1 wherein step E) comprises the step of seam-welding.

9. The method of claim 1 wherein step E) comprises the step of solder-sealing.

10. The method of claim 1 wherein step D) comprises the steps of:
    D1) applying at least one compliant conductive adhesive layer to the substrate; and
    D2) disposing at least a portion of the piezoelectric element on the at least one compliant conductive adhesive layer.

11. The method of claim 10 wherein step D1) comprises the step of depositing a silver-filled silicone layer.

12. The method of claim 10 wherein step D1) comprises the step of depositing a silver-filled epoxy layer.

13. The method of claim 10 wherein step D1) comprises the step of applying at least two conductive compliant adhesive layers; and wherein step D2) comprises the steps of:

D2a) disposing a first portion of the piezoelectric element on a first of the at least two conductive compliant adhesive layers; and D2b) disposing a second portion of the piezoelectric element on a second of the at least two conductive compliant adhesive layers.

14. A method for manufacturing a frequency control device, comprising the steps of:

A) providing a substrate;

B) providing an unsealed piezoelectric element to be disposed directly onto a portion of the substrate;

C) disposing a compensation circuit for providing temperature compensation for the unsealed piezoelectric element onto the substrate, the compensation circuit comprising an integrated circuit and a temperature sensitive device;

D) mounting the unsealed piezoelectric element directly the substrate using a compliant conductive adhesive, wherein electrical connection is provided between the unsealed piezoelectric element and the compensating circuit, to provide an untuned frequency control device; and E) providing a hermetic seal around at least the unsealed piezoelectric element and the temperature-sensitive device, wherein the unsealed piezoelectric element and the temperature-sensitive device are substantially enclosed in a single environment, to produce the frequency control device.

15. The method of claim 14 further comprising the step of:

F) frequency tuning the untuned frequency control device.

16. The method of claim 14 wherein step B) comprises providing an AT-cut strip quartz blank.

17. The method of claim 14 wherein step D) comprises the steps of:

D1) applying at least one compliant conductive adhesive layer to the substrate; and D2) disposing at least a portion of the piezoelectric element on the at least one compliant conductive adhesive layer.

18. A method for manufacturing a temperature compensated crystal oscillator (TCXO), comprising the steps of:

A) providing a substrate;

B) providing an unsealed AT-cut strip quartz crystal having a plurality of electrodes, the unsealed piezoelectric element to be disposed directly onto a portion of the substrate;

C) disposing a compensation circuit for providing temperature compensation for the unsealed piezoelectric element directly onto the substrate, the compensation circuit comprising an integrated circuit and a temperature sensitive portion thereof;

D) applying at least two silver-filled silicone adhesive layers on the substrate;

E) mounting the unsealed AT-cut strip quartz crystal onto the at least two silver-filled silicone adhesive layers, wherein electrical connection is provided between the unsealed AT-cut strip quartz crystal and the compensating circuit, to provide an untuned temperature compensated crystal oscillator; and F) providing a seam-weld around at least the unsealed AT-cut strip quartz crystal and the temperature-sensitive portion of the integrated circuit, wherein the unsealed AT-cut strip quartz crystal and the temperature-sensitive portion of the integrated circuit are substantially enclosed in a single environment to produce the TCXO.

19. The method of claim 18 further comprising the step of:

G) frequency tuning the untuned temperature compensated crystal oscillator.

20. The method of claim 19 wherein step G) comprises the step of mass loading at least one of the plurality of electrodes.

* * * * *